US008890151B2

(12) United States Patent
Hong (10) Patent No.: US 8,890,151 B2
(45) Date of Patent: Nov. 18, 2014

(54) ORGANIC LIGHT-EMITTING DISPLAY APPARATUS

(75) Inventor: Sang-Min Hong, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 2 days.

(21) Appl. No.: 13/490,273

(22) Filed: Jun. 6, 2012

(65) Prior Publication Data

US 2013/0075737 A1 Mar. 28, 2013

(30) Foreign Application Priority Data

Sep. 22, 2011 (KR) .................. 10-2011-0095822

(51) Int. Cl.
*H01L 31/00* (2006.01)
*H01L 27/32* (2006.01)

(52) U.S. Cl.
CPC ..... *H01L 27/3246* (2013.01); *H01L 2251/5392* (2013.01)
USPC .. 257/59; 257/72; 257/E27.119; 257/E27.12; 257/E27.121

(58) Field of Classification Search
USPC .................. 438/152; 257/E27.119, 59, 72
See application file for complete search history.

(56) References Cited

U.S. PATENT DOCUMENTS

| | | | |
|---|---|---|---|
| 6,005,344 A * | 12/1999 | Fleming ................... | 313/498 |
| 6,373,187 B1 * | 4/2002 | Nagayama et al. ........... | 313/506 |
| 6,414,432 B1 * | 7/2002 | Hieda et al. .................... | 313/506 |
| 7,573,195 B2 * | 8/2009 | Lifka et al. ..................... | 313/507 |
| 8,029,850 B2 | 10/2011 | Ishii | |
| 2001/0019133 A1 * | 9/2001 | Konuma et al. ................. | 257/79 |
| 2002/0024493 A1 * | 2/2002 | Ozawa et al. ................... | 345/92 |
| 2002/0163300 A1 * | 11/2002 | Duineveld et al. ............ | 313/505 |
| 2005/0140303 A1 * | 6/2005 | Lee et al. .................... | 315/169.3 |
| 2006/0023440 A1 * | 2/2006 | Miyazawa .................... | 361/792 |
| 2006/0223221 A1 * | 10/2006 | Ishii ............................... | 438/99 |
| 2007/0052349 A1 * | 3/2007 | Giraldo et al. ............... | 313/506 |
| 2007/0069619 A1 * | 3/2007 | Lifka et al. ..................... | 313/292 |
| 2007/0108889 A1 * | 5/2007 | Kim .............................. | 313/503 |
| 2007/0188081 A1 * | 8/2007 | Lee et al. ..................... | 313/504 |
| 2011/0121301 A1 | 5/2011 | Kim et al. | |

FOREIGN PATENT DOCUMENTS

| | | |
|---|---|---|
| KR | 10-0611161 | 8/2006 |
| KR | 10-2006-0105495 | 10/2006 |
| KR | 10-2007-0028122 | 3/2007 |
| KR | 10-2011-0058407 | 6/2011 |

* cited by examiner

*Primary Examiner* — Matthew W Such
*Assistant Examiner* — Samuel Lair
(74) *Attorney, Agent, or Firm* — Robert E. Bushnell, Esq.

(57) ABSTRACT

An organic light-emitting display apparatus having improved durability and image quality may include a substrate; a first electrode formed on the substrate; a first pixel definition layer formed to cover at least one lateral surface of the first electrode; a second pixel definition layer formed so as to be spaced apart from at least an upper surface of the first pixel definition layer; an intermediate layer formed on the first electrode and including an organic light-emitting layer; and a second electrode formed on the intermediate layer.

19 Claims, 4 Drawing Sheets

ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 22$^{nd}$ of Sep. 2011 and there duly assigned Serial No. 10-2011-0095822.

BACKGROUND OF THE INVENTION

1. Field of the Invention

The present invention relates to an organic light-emitting apparatus, and more particularly, to an organic light-emitting apparatus having improved durability and image quality.

2. Description of the Related Art

Developments in display technology have led to the replacement of conventional display apparatuses with portable, thin flat panel display devices. From among the flat panel devices, an organic light-emitting display apparatus, which is a self-emissive display apparatus, has a wide viewing angle, high contrast ratio, exceptional thinness, enhanced compactedness, and high response speed, and thus should probably be considered as the next-generation display apparatus.

An organic light-emitting display apparatus may be constructed with a first electrode, a second electrode, and an intermediate layer. The intermediate layer includes an organic emission layer that emits visible light when a voltage is applied to the first and second electrodes.

An electrical insulating layer, such as a pixel definition layer, is formed on a predetermined portion of the first electrode. Thus, the first electrode and the second electrode do not directly contact each other.

The edges of the first and second electrodes are likely to contact each other in response to the application of an external force or a transverse impulse, or by a shocks or the like, and thus create a short circuit between the first and second electrodes, thereby causing problems with image quality, such as a formation of a dark spot on the otherwise brilliant screen of the display apparatus.

Accordingly, any improvement of the durability and image quality of an organic light-emitting display apparatus is limited.

SUMMARY OF THE INVENTION

The present invention contemplates an organic light-emitting apparatus for improving durability and image quality.

According to an aspect of the present invention, there is provided an organic light-emitting display apparatus which may include a substrate, a first electrode formed on the substrate, a first pixel definition layer formed to cover at least one lateral surface of the first electrode, a second pixel definition layer formed so as to be spaced apart from at least an upper surface of the first pixel definition layer, an intermediate layer, including an organic light-emitting layer, formed on the first electrode, and a second electrode formed on the intermediate layer.

The first pixel definition layer may be spaced apart from an extension line of a top surface of the second pixel definition layer.

The first pixel definition layer may be shorter in height relative to the underlying substrate, than the second pixel definition layer.

A top surface of the first pixel definition layer may be positioned below an extension line of a top surface of the second pixel definition layer.

A thickness of at least a portion of the second pixel definition layer may be greater than a thickness of the first pixel definition layer.

The first pixel definition layer may be formed to cover a first lateral surface of the first electrode and a second lateral surface of the first electrode that faces the first lateral surface.

The first pixel definition layer may be formed to cover all lateral surfaces of the first electrode.

At least a portion of the first pixel definition layer may be spaced apart from the second pixel definition layer.

The intermediate layer may contact a lateral surface of the first pixel definition layer.

The intermediate layer may be formed so as not to be spaced apart from the first pixel definition layer.

The organic light-emitting display apparatus may further include a thin film transistor (TFT) that is electrically connected to the first electrode and which includes an active layer, a gate electrode, a source electrode, and a drain electrode.

The second pixel definition layer may include a first layer and a second layer formed on at least a portion of the first layer.

The first pixel definition layer may be formed to cover a lateral surfaces of the first electrode facing the second layer of the second pixel definition layer.

The first pixel definition layer may be spaced apart from the second layer of the second pixel definition layer.

The second layer of the second pixel definition layer may be formed to face a first lateral surface and a second lateral surface facing the first lateral surface from among lateral surfaces of the first electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, exemplary embodiments of the present invention will be described in detail with reference to the accompanying drawings simply by way of illustration. As used herein, the term "and/or" includes any and all combinations of one or more of the associated listed items. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to a being "on" another element, it may be positioned directly upon the other element or be positioned indirectly upon the other element with one or more intervening elements interposed therebetween. Also, when an element is referred to as being "connected to" another element, it may be directly connected to the other element or be indirectly connected to the other element with one or more intervening elements interposed therebetween. Hereinafter, like reference numerals refer to like elements.

For convenience, in these exemplary embodiments of the present invention, the term "display panel" commonly refers to a panel in which the substrate (such as a substrate including an organic light emitting diode) and the encapsulation substrate for encapsulating at least some region of the substrate adhere to each other by the assistance of a sealing agent (i.e., a sealant) such as a frit.

Figure 1:
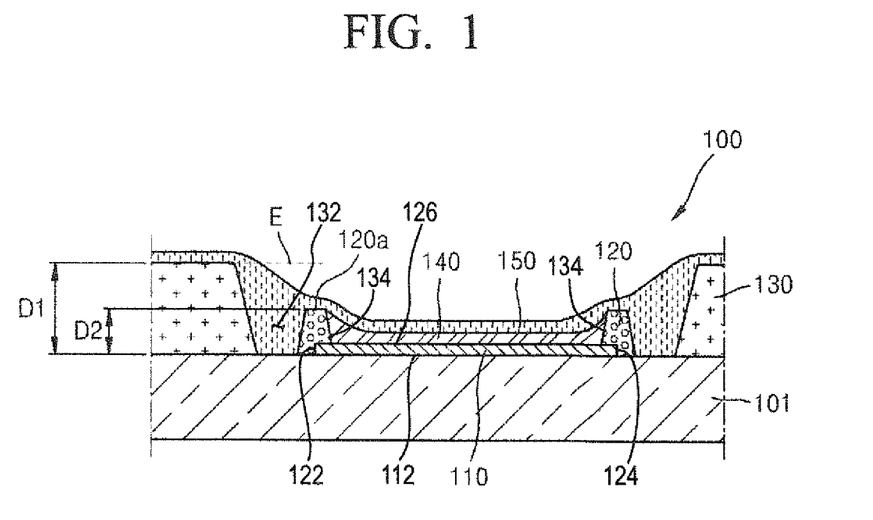
FIG. 1 is a schematic cross-sectional view of an organic light-emitting display apparatus constructed as a first embodiment of the present invention.

FIG. 1 is a schematic cross-sectional view of an organic light-emitting display apparatus 100 constructed as a first embodiment of the principles of the present invention.

Figure 6:
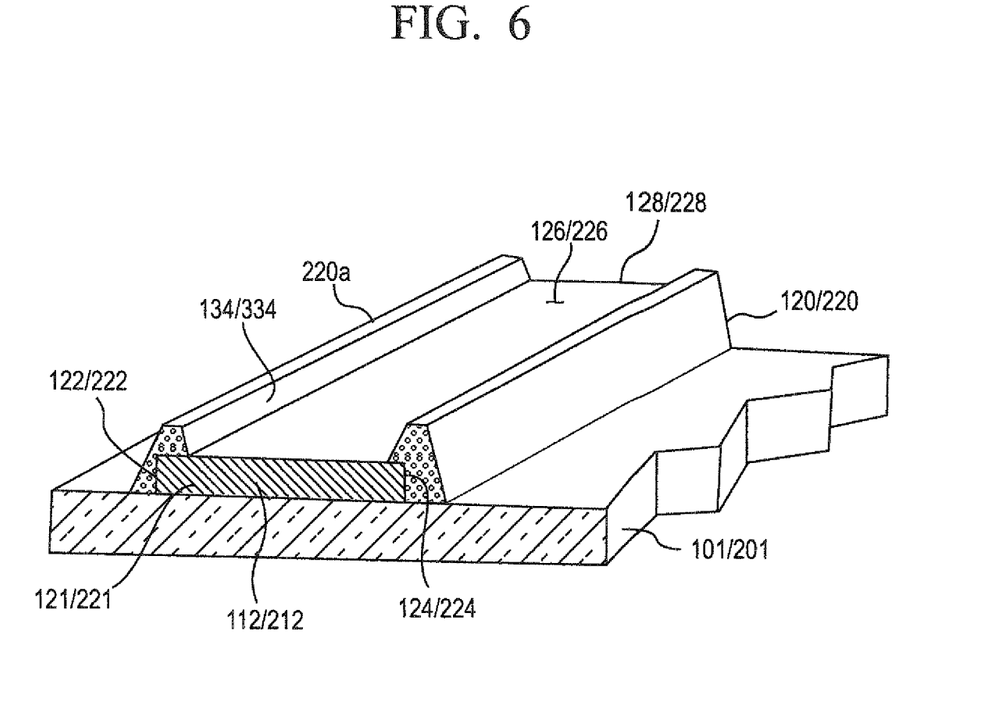
FIG. 6 is a detailed view illustrating the orientation of the various sides, surfaces and structural features described in the following description.

Referring to FIGS. 1 and 6 together, the organic light-emitting display apparatus 100 includes a substrate 101, a first electrode 110, a first pixel definition layer 120, a second pixel definition layer 130, an intermediate layer 140, and a second electrode 150.

The substrate 101 may be formed of a transparent glass material mainly including $SiO_2$. Substrate 101 may, however, be formed of a transparent plastic material. A plastic substrate may be formed of an organic, electrically insulating material such as an organic material selected from a group of materials such as polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose tri-acetate (TAC), and cellulose acetate propionate (CAP).

Alternatively, the substrate 101 may be formed of metal, for example, a metal foil.

The first electrode 110 is disposed on the substrate 101. The first electrode 110 may be formed so as to have a predetermined pattern by using a photolithography technique. Although not illustrated, a buffer layer (not shown) may be formed between the substrate 101 and the first electrode 110, may make the substrate 101 smooth, and may prevent impurities from penetrating into the substrate 101. The buffer layer may be formed of $SiO_2$ and/or $SiN_x$.

The first electrode 110 may be formed so as to contain various conductive materials.

The first pixel definition layer 120 is disposed on the first electrode 110. In detail, the first pixel definition layer 120 is formed to cover at least one lateral surface 122 of the first electrode 110. As shown in FIGS. 1 and 6, the first pixel definition layer 120 may be formed to cover a left lateral surface 122 of the first electrode 110 and a right lateral surface 124 of the first electrode 110, which faces, and is spaced apart from, the left lateral surface 122.

The present invention is not limited to the foregoing embodiments. That is, the first pixel definition layer 120 may be formed to cover the majority of an upper lateral surface 128 of the first electrode 110 and a lower lateral surface 121 of the first electrode 110. In addition, the first pixel definition layer 120 may be formed to cover all lateral surfaces 121, 122, 124 and 128 of the first electrode 110.

The first pixel definition layer 120 may not cover an entire upper surface of the first electrode 110, but may be formed to expose a major surface, namely a predetermined region 126 of an upper surface of the first electrode 110, as is illustrated by FIG. 1.

The second pixel definition layer 130 is formed on the substrate 101 so as to be spaced apart from an upper surface 120a of the first pixel definition layer 120. In addition, an extension line E of a top surface of the second pixel definition layer 130 is spaced apart from the first pixel definition layer 120. That is, the upper surface 120a of the first pixel definition layer 120 is positioned below the extension line E.

To this end, for example, a thickness D2 of at least a portion of the first pixel definition layer 120 is smaller than a thickness D1 of the second pixel definition layer 130.

In addition, at least a portion of the first pixel definition layer 120 is spaced apart from the second pixel definition layer 130 so as to form a space 132 between the first pixel definition layer 120 and the second pixel definition layer 130.

The first pixel definition layer 120 and the second pixel definition layer 130 may be formed of an electrically insulating material and may be formed of the same material. The present invention is not limited thereto, however. That is, the first pixel definition layer 120 and the second pixel definition layer 130 may be formed from different materials.

The intermediate layer 140 is formed on the first electrode 110. The intermediate layer 140 includes an organic light-emitting layer. The intermediate layer 140 is disposed so as to contact the lateral surface 126 of the first pixel definition layer 120. The intermediate layer 140 may be formed so as not to be spaced apart from the first pixel definition layer 120. Intermediate layer 140 may be disposed to overlay, or to overlay and directly contact a majority of the surface of first electrode 110 located between the spaced-apart side walls 134 of first pixel definition layer 120.

The organic light-emitting layer of the intermediate layer 140 may emit visible rays characterized by various colors, for example, red, green, and blue.

The second electrode 150 is disposed on the intermediate layer 140. The second electrode 150 may be formed so as to contain various electrically conductive materials.

The second electrode 150 may also be formed on, cover, and partially, or entirely, encase the first pixel definition layer 120, and the second pixel definition layer 130, and may not have a predetermined pattern.

Although not illustrated, an encapsulation member (not shown) may be disposed on the second electrode 150 so as to face, and be generally coplanar and substantially coextensive with, a major surface of the substrate 101. The encapsulation member is formed to protect the intermediate layer 140 from external moisture and from oxygen, and may be formed of glass or plastic, or it may be formed by stacking at least one layer made from other organic and inorganic materials.

The organic light-emitting display apparatus 100 includes the first pixel definition layer 120 and the second pixel definition layer 130. The extension line E of the top surface of the second pixel definition layer 130 is spaced apart from the first pixel definition layer 120 and from the upper surface 120a.

Accordingly, when an external force, impulse, or pressure, such as an external shock, is applied to the organic light-emitting display apparatus 100, the first electrode 110 and the second electrode 150 may be prevented from being damaged, as will be described in detail.

Conventionally, and in some embodiments, the first and second electrodes 110 and 150, respectively, of the organic light-emitting display apparatus 100 may be expected to make electrical contact with each other in response to external force, impulse, or pressure, and thereby create an electrical short circuit, thus causing problems with image quality, such as by creating a dark spot. In particular, an insulating material of a pixel definition layer that covers a lateral surface of the first electrode 110 is pressed by external pressure, and thus the lateral surface of the first electrode 110 may deleteriously contact the second electrode 150.

When an external pressure is applied to embodiments of the present invention however, the external pressure is transferred to the second pixel definition layer 130. The second pixel definition layer 130 may be spaced electrically and physically apart from the upper surface 120a of the first pixel definition layer 120. That is, even if a pressure is applied to the second pixel definition layer 130, the pressure is primarily transferred to the second pixel definition layer 130 and is barely transferred to the first pixel definition layer 120. Thus, the first pixel definition layer 120 is not pressed or damaged. Accordingly, the first pixel definition layer 120 may effectively protect the lateral surfaces 121, 122, 124, 128 that form the peripheral side walls, or edges of the first electrode 110. In addition, even if external forces, impulses or shocks are applied to display apparatus 110, the first electrode 110 may be prevented from electrically or physically contacting the second electrode 150.

In particular, at least a portion of the first pixel definition layer 120 may be spaced apart from the second pixel definition layer 130. Thus, when external pressure is applied to the second pixel definition layer 130, the external pressure may be effectively prevented from being transferred to the first pixel definition layer 120 from the second pixel layer 130.

As a result, the durability and image quality of organic light-emitting display apparatus 100 are improved.

Figure 2:
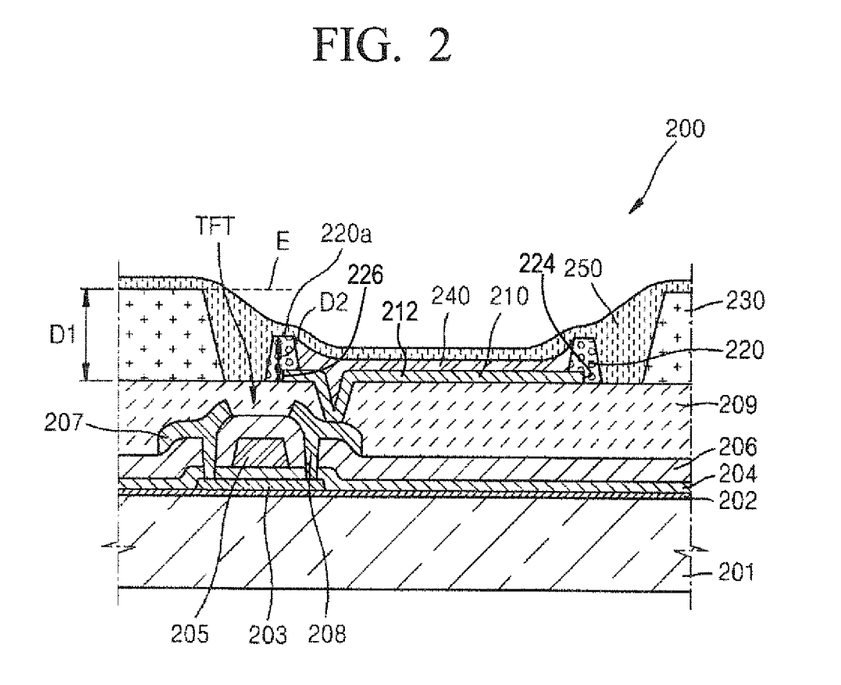
FIG. 2 is a schematic cross-sectional view of an organic light-emitting display apparatus constructed as a second embodiment of the present invention.

FIG. 2 is a schematic cross-sectional view of an organic light-emitting display apparatus fabricated as a second embodiment of the present invention.

Referring to FIGS. 2 and 6, the organic light-emitting display apparatus 200 includes a substrate 201, a thin film transistor TFT, a first electrode 210, a first pixel definition layer 220, a second pixel definition layer 230, an intermediate layer 240, and a second electrode 250. The thin film transistor TFT includes an active layer 203, a gate electrode 205, a source electrode 207, and a drain electrode 208.

Structures of these components may be described in detail.

A buffer layer 202 is formed on the substrate 201. The buffer layer 202 may include $SiO_2$ or $SiN_x$. In addition, the buffer layer 202 may be formed by stacking a plurality of layers. The buffer layer 202 makes the substrate 201 smooth and prevents external moisture and impurities from penetrating into the thin film transistor TFT through a lower portion of the substrate 201.

The active layer 203 has a predetermined pattern and is formed on the buffer layer 202. The active layer 203 may be formed of an inorganic semiconductor such as amorphous silicon or poly silicon, or an organic semiconductor, and may include a source region, a drain region, and a channel region. A gate insulating layer 204 is formed on the active layer 203. The gate insulating layer 204 may include various insulating materials.

The gate electrode 205 is formed on a predetermined portion of the gate insulating layer 204. The gate electrode 205 is connected to a gate line (not shown) for applying TFT on/off signals. The gate electrode 205 may be formed of metal or a metal alloy such as gold (Au), silver (Ag), copper (Cu), nickel (Ni), platinum (Pt), palladium (Pd), aluminum (Al), molybdenum (Mo), a Al:Nd alloy, a Mo:W alloy, or the like, but it is not limited thereto.

An interlayer electrical insulating layer 206 is formed on the gate electrode 205 so as to expose portions of the source and drain regions of the active layer 203.

The source electrode 207 and the drain electrode 208 are formed so as to contact the exposed portions of the source and drain regions, respectively, of the active layer 203.

A passivation layer 209 is formed to cover the thin film transistor TFT.

The first electrode 210 is formed on the passivation layer 209. In detail, the passivation layer 209 may be formed to expose a portion of the drain electrode 208 therethrough, and the first electrode 210 is connected to the exposed portion of the drain electrode 208.

The first electrode 210 may be formed so as to contain various electrically conductive materials.

The first pixel definition layer 220 is disposed on the first electrode 210. In detail, the first pixel definition layer 220 is formed to cover at least one major lateral surface 226 of the first electrode 210. As shown in FIG. 2, the first pixel definition layer 220 may be formed to cover a left lateral surface 222 of the first electrode 210 and a right lateral surface 224 of the first electrode 210, shown opposite from the left lateral surface 222.

The present invention is not limited thereto. That is, the first pixel definition layer 220 may be formed to cover the opposite longitudinally extending edges, or side walls 221, 222, 224, 228 of an upper lateral surface 226 of the first electrode 210 and a lower lateral surface 212 of the first electrode 210. In addition, the first pixel definition layer 220 may be formed to cover all lateral surfaces 221, 222, 224, 228 of the first electrode 210.

The first pixel definition layer 220 may not cover an entirety of upper surface 226 of the first electrode 210, but may be formed to expose a predetermined region of the upper surface 226 of the first electrode 210.

The second pixel definition layer 230 is formed on passivation layer 209 for the substrate 201 so as to be spaced apart from an upper surface 220a of the first pixel definition layer 220. In addition, an extension line E of a top surface of the second pixel definition layer 230 is spaced apart from the first pixel definition layer 220. That is, the upper surface 220a of the first pixel definition layer 220 is positioned below the extension line E because first pixel definition layer 220 lacks the height of second pixel definition layer 230.

To this end, for example, a thickness D2 of at least a portion of the first pixel definition layer 220 is smaller than a thickness D1 of the second pixel definition layer 230.

The first pixel definition layer 220 and the second pixel definition layer 230 may be formed of an electrically insulating material, and may be formed of the same material. The present invention is not limited thereto, however. That is, the first pixel definition layer 220 and the second pixel definition layer 230 may also be formed of different materials.

The intermediate layer 240 is formed on the first electrode 210. The intermediate layer 240 includes an organic light-emitting layer. The intermediate layer 240 is disposed so as to contact opposite lateral surfaces 222, 224 of the first pixel definition layer 220. The intermediate layer 240 may be formed so as not to be spaced apart from the first pixel definition layer 220.

The organic light-emitting layer of the intermediate layer 240 may emit visible rays and may realize various colors, for example, red, green, and blue.

The second electrode 250 is disposed on the intermediate layer 240. The second electrode 250 may be formed so as to contain various electrically conductive materials.

The second electrode 250 may also be formed on the first pixel definition layer 220 and the second pixel definition layer 230, and may not have a predetermined pattern.

Although not illustrated, an encapsulation member (not shown) may be disposed on the second electrode 250 so as to face a surface of the substrate 201. The encapsulation member is formed to protect the intermediate layer 240 from external moisture or oxygen, and may be formed of glass or plastic, or the encapsulation member may be formed by stacking at least one layer formed of other organic and inorganic materials.

The organic light-emitting display apparatus 200 is an active matrix (AM) type, but the display apparatus is not limited to an active matrix type display apparatus. That is, a passive material (PM) type organic light-emitting display apparatus may also be used.

Figure 3:
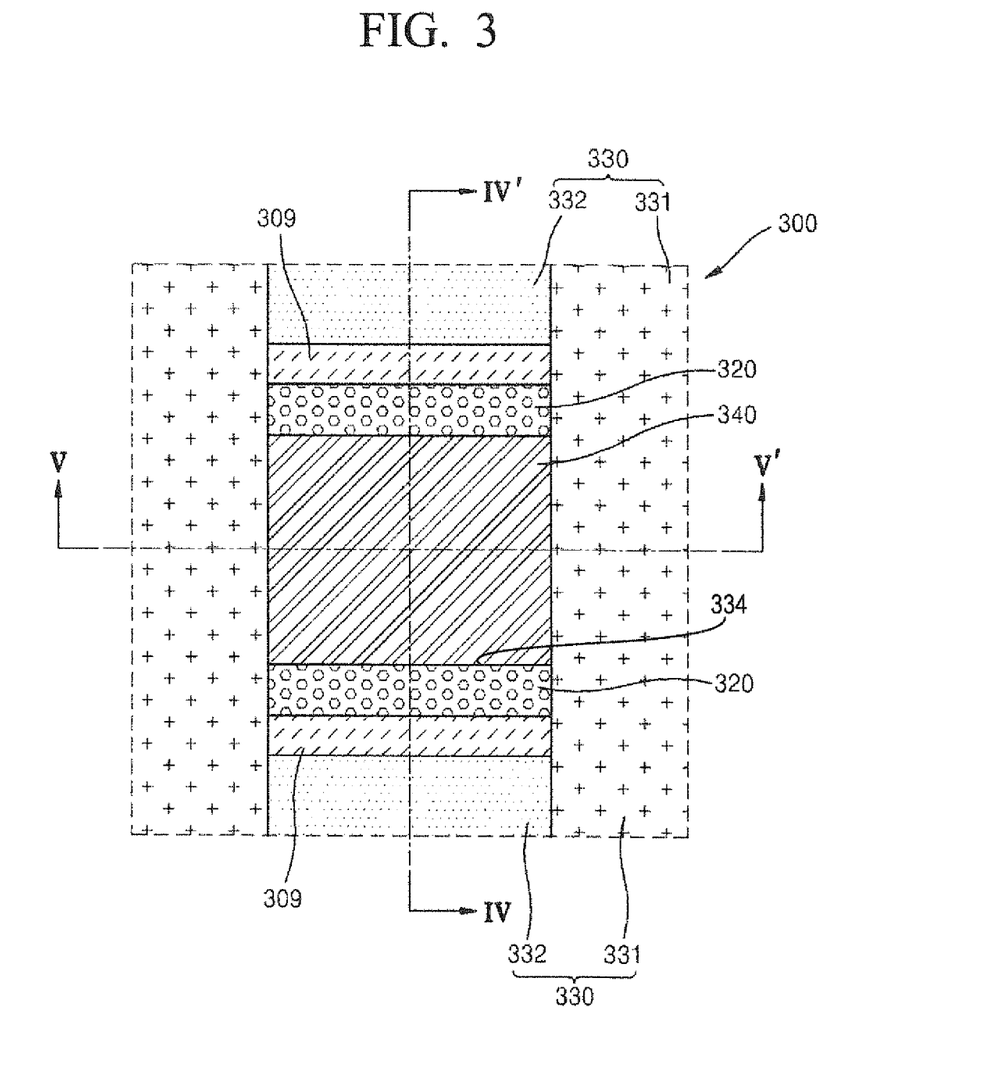
FIG. 3 is a schematic plan view of an organic light-emitting display apparatus constructed as a third embodiment of the present invention.
Figure 4:
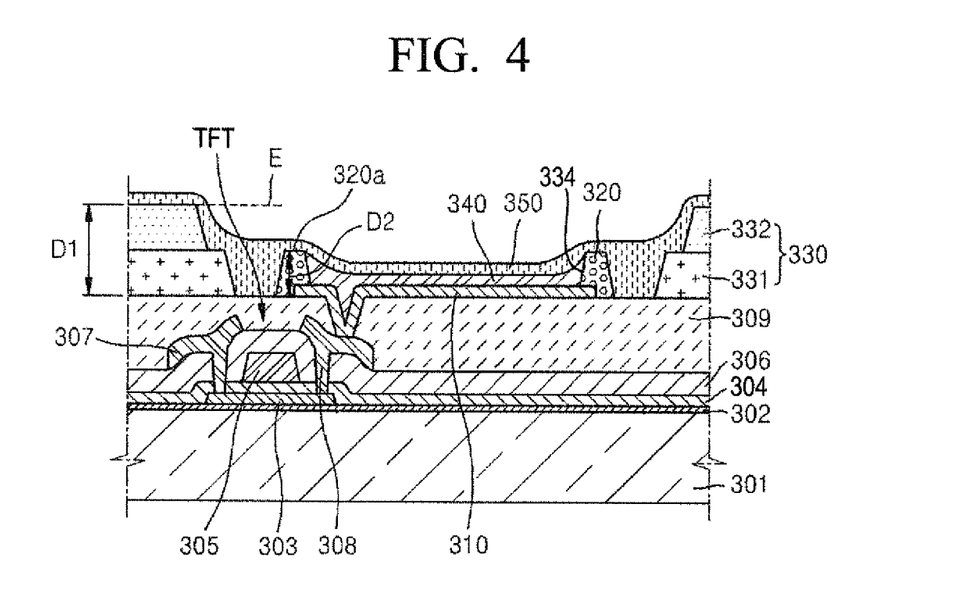
FIG. 4 is a cross-sectional view of the organic light-emitting display apparatus taken along a sectional line IV-IV' in FIG. 3.
Figure 5:
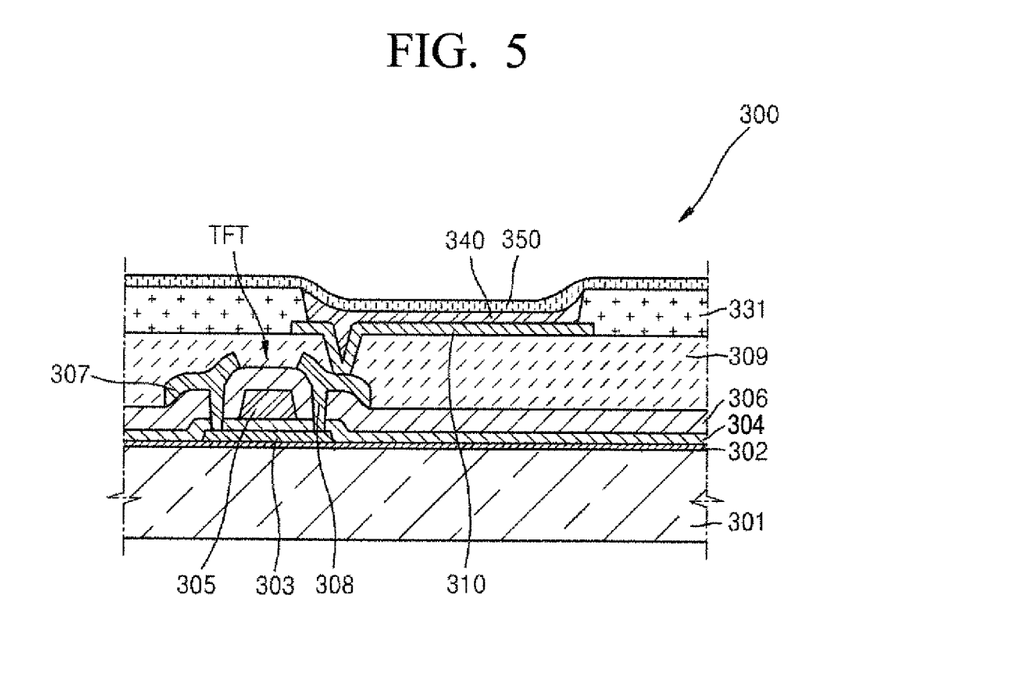
FIG. 5 is a cross-sectional view of the organic light-emitting display apparatus taken along a sectional line V-V' in FIG. 3.

FIG. 3 is a schematic plan view of an organic light-emitting display apparatus according to a third embodiment of the present invention, FIG. 4 is a cross-sectional view of the organic light-emitting display apparatus taken along a line IV-IV of FIG. 3, and FIG. 5 is a cross-sectional view of the organic light-emitting display apparatus taken along a line V-V of FIG. 3.

Referring to FIGS. 3 through 5, the organic light-emitting display apparatus 300 includes a substrate 301, the thin film transistor TFT, a first electrode 310, a first pixel definition layer 320, a second pixel definition layer 330, an intermediate layer 340, and a second electrode 350.

The thin film transistor TFT includes an active layer 303, a gate electrode 305, a source electrode 307, and a drain electrode 308.

The second pixel definition layer 330 includes a first layer 331 and a second layer 332 formed on the first layer 331.

Structures of the components will be descried in detail.

A buffer layer 302 is formed on the substrate 301. The buffer layer 302 may include $SiO_2$ or $SiN_x$. In addition, the buffer layer 302 may be formed by stacking a plurality of layers. The buffer layer 302 makes the substrate 301 smooth and prevents external moisture and impurities from penetrating into the thin film transistor TFT through a lower portion of the substrate 301.

The active layer 303 has a predetermined pattern and is formed on the buffer layer 302. The active layer 303 may be formed of an inorganic semiconductor such as amorphous silicon or poly silicon, or an organic semiconductor, and may include a source region, a drain region, and a channel region. A gate insulating layer 304 is formed on the active layer 303. The gate insulating layer 304 may include various insulating materials.

The gate electrode 305 is formed on a predetermined portion of the gate insulating layer 304. The gate electrode 305 is connected to a gate line (not shown) for applying TFT on/off signals. The gate electrode 305 may be formed of metal or a metal alloy such as Au, Ag, Cu, Ni, Pt, Pd, Al, Mo, a Al:Nd alloy, a Mo:W alloy, or the like, but it is not limited thereto.

An interlayer insulating layer 306 is formed on the gate electrode 305 so as to expose portions of the source and drain regions of the active layer 303.

The source electrode 307 and the drain electrode 308 are formed so as to contact the exposed portions of the source and drain regions, respectively, of the active layer 303.

A passivation layer 309 is formed to cover the thin film transistor TFT.

The first electrode 310 is formed on the passivation layer 309. In detail, the passivation layer 309 may be formed so as to expose a portion of the drain electrode 308 therethrough, and the first electrode 310 is connected to the exposed portion of the drain electrode 308.

The first electrode 310 may be formed so as to contain various conductive materials.

The first pixel definition layer 320 and the second pixel definition layer 330 are formed on the first electrode 310 and on the passivation layer 309, respectively. The second pixel definition layer 330 includes the first layer 331 and the second layer 332.

The second layer 332 of the second pixel definition layer 330 is formed on a predetermined portion of the first layer 331. As shown in FIGS. 3 through 5, the second layer 332 may be disposed on the first layer 331 so as to face upper and lower lateral surfaces from among lateral surfaces of the first electrode 310.

The first pixel definition layer 320 is formed to cover at least one lateral surface of the first electrode 310. As shown in FIGS. 3 through 5, the first pixel definition layer 320 may be formed to cover an upper lateral surface of the first electrode 310 and a lower lateral surface of the first electrode 310, which faces the upper lateral surface. That is, the first pixel definition layer 320 may be disposed to cover lateral surfaces facing the second layer 332 from among lateral surfaces of the first electrode 310.

However, the present invention is not limited thereto. That is, the first pixel definition layer 320 may be formed to cover all lateral surfaces of the first electrode 310. However, in order to prevent a reduction in the size of each sub-pixel, that is a reduction in an area for forming the intermediate layer 340, the first pixel definition layer 320 may cover lateral surfaces facing the second layer 332 from among lateral surfaces of the first electrode 310.

In addition, the first pixel definition layer 320 is formed so as to be spaced apart from the second layer 332.

The first pixel definition layer 320 may not cover an entire upper surface of the first electrode 310, but it may be formed so as to expose a predetermined region of an upper surface of the first electrode 310. As shown in FIG. 5, the first layer 331 of second pixel definition layer 330 is formed to cover the right and left lateral surfaces of the first electrode 310, which are not covered by the first pixel definition layer 320, and to expose a predetermined portion of an upper surface of the first electrode 310.

An upper surface 320a of the first pixel definition layer 320 is spaced apart from the second pixel definition layer 330. An extension line E of a top surface of the second pixel definition layer 330 is spaced apart from the first pixel definition layer 320. That is, the upper surface 320a of the first pixel definition layer 320 is positioned below the extension line E.

To this end, for example, a thickness D2 of at least a portion of the first pixel definition layer 320 is smaller than a thickness D1 of the second pixel definition layer 330. In detail, the sum of the thicknesses of the first layer 331 and the second layer 332 of the second pixel definition layer 330 is greater than the thickness D2 of the first pixel definition layer 320.

The first pixel definition layer 320 and the second pixel definition layer 330 may be formed of an insulating material and may be formed of the same material. However, the present invention is not limited thereto. That is, the first pixel definition layer 320 and the second pixel definition layer 330 may be formed of different materials.

The first layer 331 and the second layer 332 of the second pixel definition layer 330 may be formed of the same material or different materials.

The intermediate layer 340 is disposed on the first electrode 310. The intermediate layer 340 includes an organic light-emitting layer. The intermediate layer 340 is disposed so as to contact a lateral surface of the first pixel definition layer 320. The intermediate layer 340 may be formed so as not to be spaced apart from the first pixel definition layer 320. In addition, a portion of the intermediate layer 340, on which the first pixel definition layer 320 is not formed, contacts a lateral surface of the second pixel definition layer 330.

The organic light-emitting layer of the intermediate layer 340 may emit visible rays and may realize various colors, for example, red, green, and blue.

The second electrode 350 is disposed on the intermediate layer 340. The second electrode 350 may be formed so as to contain various conductive materials.

The second electrode 350 may also be formed on the first pixel definition layer 320, and the second pixel definition layer 330 and may not have a predetermined pattern.

Although not illustrated, an encapsulation member (not shown) may be disposed on the second electrode 350 so as to face a surface of the substrate 301. The encapsulation member is formed to protect the intermediate layer 340 from external moisture or oxygen, and may be formed of glass or plastic, or it may be formed by stacking at least one layer formed of other organic and inorganic materials.

The organic light-emitting display apparatus 300 includes the first pixel definition layer 320 and the second pixel definition layer 330. The extension line E of the top surface of the second pixel definition layer 330 is spaced apart from the upper surface 320a of the first pixel definition layer 320.

When an external pressure is applied, the external pressure is transferred to the second pixel definition layer 330. In particular, the external pressure is mostly transferred to the second layer 332 of the second pixel definition layer 330. The second pixel definition layer 330 is spaced apart from the upper surface 320a of the first pixel definition layer 320. That is, even if a pressure is applied to the second layer 332 of the second pixel definition layer 330, the pressure is not transferred to the first pixel definition layer 320, and thus the first pixel definition layer 320 is not pressed or damaged. Accordingly, the first pixel definition layer 320 may effectively protect lateral surfaces of the first electrode 310. In addition, even if external shocks are applied, the first electrode 310 may be prevented from contacting the second electrode 350. In particular, the first pixel definition layer 320 is spaced apart from the second layer 332, thereby easily preventing pressure applied during external shocks from being transferred to the first pixel definition layer 320.

In addition, the first pixel definition layer 320 is formed so as to face the second layer 332 of the second pixel definition layer 330 and to cover a lateral surface of the first electrode 310, thereby easily performing processes and effectively preventing a reduction in areas of sub-pixels.

According to one or more embodiments of the present invention, an organic light-emitting display apparatus may have improved durability and image quality.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
    a substrate;
    a first electrode formed on the substrate, said first electrode having a top horizontal surface, a bottom horizontal surface, a first vertical surface located at a first side of the first electrode for connecting first ends of the top horizontal surface and the bottom horizontal surface to each other, and a second vertical surface located at a second side of the first electrode for connecting second ends of the top horizontal surface and the bottom horizontal surface to each other;
    a first pixel definition layer having a first portion formed to cover the first vertical surface of the first electrode and a second portion formed to cover the second vertical surface of the first electrode;
    a second pixel definition layer formed so as to be spaced apart from at least an upper surface of the first pixel definition layer and having a first portion disposed on a first side of the first portion of the first pixel definition layer and a second portion disposed on a second side of the second portion of the first pixel definition layer;
    an intermediate layer formed on the first electrode, extending from the first side of the first electrode to the second side of the first electrode, and comprising an organic light-emitting layer; and
    a second electrode formed on the intermediate layer and extending continuously over the first portion of the second pixel definition layer, the first portion of the first pixel definition layer, the intermediate layer, the second portion of the first pixel definition layer, and the second portion of the second pixel definition layer;
    wherein the intermediate layer is formed so as to be separated from the second pixel definition layer.

2. The organic light-emitting display apparatus of claim 1, wherein the first pixel definition layer is spaced apart from an extension line of a top surface of the second pixel definition layer.

3. The organic light-emitting display apparatus of claim 1, wherein a top surface of the first pixel definition layer is positioned below an extension line of a top surface of the second pixel definition layer.

4. The organic light-emitting display apparatus of claim 1, wherein a thickness of at least a portion of the second pixel definition layer is greater than a thickness of the first pixel definition layer.

5. The organic light-emitting display apparatus of claim 1, wherein the first pixel definition layer is formed to cover all vertical surfaces of the first electrode.

6. The organic light-emitting display apparatus of claim 1, wherein at least a portion of the first pixel definition layer is spaced apart from the second pixel definition layer.

7. The organic light-emitting display apparatus of claim 1, wherein the intermediate layer contacts a vertical surface of the first pixel definition layer.

8. The organic light-emitting display apparatus of claim 1, wherein the intermediate layer is formed so as not to be spaced apart from the first pixel definition layer.

9. An organic light-emitting display apparatus, comprising:
    a substrate;
    a passivation layer formed on the substrate;
    a first electrode formed on the passivation layer;
    a first pixel definition layer formed to cover at least one vertical surface of the first electrode;
    a second pixel definition layer formed so as to be spaced apart from at least an upper surface of the first pixel definition layer;
    an intermediate layer formed on the first electrode and comprising an organic light-emitting layer;
    a second electrode formed on the intermediate layer; and a thin film transistor (TFT) electrically connected to the first electrode and including an active layer, a gate electrode, a source electrode, and a drain electrode;

wherein the first electrode is connected to the thin film transistor (TFT) through an opening formed in the passivation layer;

wherein the first pixel definition layer comprises a first portion formed to cover a first vertical surface of the first electrode and a second portion formed to cover a second vertical surface of the first electrode; and wherein the first electrode comprises a top horizontal surface and a bottom horizontal surface, the first vertical surface being located at a first end of the first electrode for connecting the top horizontal surface and the bottom horizontal surface to each other, the second vertical surface being located at a second end of the first electrode for connecting the top horizontal surface and the bottom horizontal surface to each other.

10. The organic light-emitting display apparatus of claim 9, wherein the second pixel definition layer comprises a first layer and a second layer formed on at least a portion of the first layer.

11. The organic light-emitting display apparatus of claim 9, wherein the first pixel definition layer is formed to cover a vertical surface, facing the second layer of the second pixel definition layer, from among vertical surfaces of the first electrode.

12. The organic light-emitting display apparatus of claim 10, wherein the first pixel definition layer is spaced apart from the second layer of the second pixel definition layer.

13. The organic light-emitting display apparatus of claim 10, wherein the second layer of the second pixel definition layer is formed so as to face both a left vertical surface and a right vertical surface of the first electrode.

14. The organic light-emitting display apparatus of claim 9, further comprising an interlayer electrical insulation layer disposed between the passivation layer and the substrate.

15. The organic light-emitting display apparatus of claim 14, further comprising a gate insulation layer disposed between the interlayer electrical insulation layer and the substrate.

16. The organic light-emitting display apparatus of claim 15, further comprising a buffer layer disposed between the gate insulation layer and the substrate.

17. The organic light-emitting display apparatus of claim 14, further comprising a buffer layer disposed between the interlayer electrical insulation layer and the substrate.

18. The organic light-emitting display apparatus of claim 17, wherein the thin film transistor (TFT) is disposed on the buffer layer.

19. The organic light-emitting display apparatus of claim 16, wherein the thin film transistor (TFT) is disposed on the buffer layer.

* * * * *